United States Patent [19]

Eguchi et al.

[11] Patent Number: 5,547,775
[45] Date of Patent: Aug. 20, 1996

[54] CIRCUIT FOR PREVENTING OVERCHARGE AND OVERDISCHARGE OF SECONDARY BATTERIES

[75] Inventors: Yasuhito Eguchi, Kanagawa; Masayuki Sato, Tokyo; Toshio Narushima, Kanagawa; Akira Sanpei, Fukushima; Kanji Murano, Tokyo, all of Japan

[73] Assignee: Sony Corporation, Tokyo, Japan

[21] Appl. No.: 226,105

[22] Filed: Apr. 11, 1994

Related U.S. Application Data

[63] Continuation-in-part of Ser. No. 921,758, Jul. 30, 1992, abandoned.

[30] Foreign Application Priority Data

Apr. 26, 1991 [JP] Japan ............................ 3-097734
Jul. 31, 1991 [JP] Japan ............................ 3-213019

[51] Int. Cl.$^6$ ........................................... H02J 7/00
[52] U.S. Cl. ........................ 429/7; 429/61; 320/17; 320/6; 320/8; 320/31; 320/39; 320/40
[58] Field of Search ................. 429/61, 7; 320/17, 320/6, 8, 31, 39, 40

[56] References Cited

U.S. PATENT DOCUMENTS

| | | | |
|---|---|---|---|
| 3,543,043 | 11/1970 | Dunn | 307/18 |
| 4,086,525 | 4/1978 | Ibsen et al. | 320/33 |
| 4,583,035 | 4/1987 | Sloan | 320/22 |
| 4,743,830 | 5/1988 | Lakey | 320/17 X |
| 4,820,965 | 4/1989 | Siemer | 320/31 |
| 4,820,966 | 4/1989 | Fridman | 320/32 |
| 4,910,103 | 3/1990 | Yoshikawa et al. | 429/61 |
| 4,967,136 | 10/1990 | Nofzinger | 320/17 X |
| 5,017,856 | 5/1991 | Johnson | 429/7 X |
| 5,153,496 | 10/1992 | LaForge | 320/17 |
| 5,304,915 | 4/1994 | Sanpei et al. | 320/14 |

FOREIGN PATENT DOCUMENTS

| | | |
|---|---|---|
| 0319020 | 6/1989 | European Pat. Off. . |
| 2735114 | 2/1979 | Germany . |
| 2928503 | 1/1981 | Germany . |
| 3611484 | 10/1987 | Germany . |
| 4-331425 | 11/1992 | Japan . |

OTHER PUBLICATIONS

"Soviet Inventions Illustrated", EL section, Derwent Publ., week D 51, p. 4, Feb. 3, 1982.
"Soviet Inventions Illustrated, EL section, Derwent Publ.", pp. 12–13, Aug. 8, 1984.

Primary Examiner—Mark F. Huff
Attorney, Agent, or Firm—Hill, Steadman & Simpson

[57] ABSTRACT

Circuit for preventing overcharge and overdischarge of secondary batteries is disclosed. Overcharge detecting comparators COMP2 and COMP4 each having a hysteresis circuit 1 are connected between positive and negative electrodes of series-connected secondary batteries Abat and Bbat, and overdischarge detecting comparators COMP1 and COMP3 each having a hysteresis circuit 2 are connected also between the above electrodes. Transistors T1, T2 and a resistor R are connected between the batteries for overflow of overcharge and balance of overdischarge. Upon detection of any overcharge by the comparator COMP2 or COMP4, the charge current is interrupted by a transistor T6, and simultaneously the overcharge overflow is discharged by the hysteresis circuit until the battery voltage is lowered to the hysteresis voltage. And after the discharge, the transistor T6 is turned on to resume recharging the batteries. Meanwhile, upon detection of any overdischarge by the comparator COMP1 or COMP3, the discharge current is interrupted by a transistor T5. Thus the overcharge and the overdischarge can be balanced by the hysteresis circuits 1 and 2 respectively.

8 Claims, 8 Drawing Sheets

CIRCUIT FOR PREVENTING OVERCHARGE AND OVERDISCHARGE OF SECONDARY BATTERIES

This is a continuation-in-part, of application Ser. No. 07/921,758, filed Jul. 30, 1992, now abandoned.

BACKGROUND OF THE INVENTION

The present invention relates to a circuit for preventing overcharge and overdischarge of secondary batteries.

There has been known heretofore the following method as a preventive measure against overcharge and overdischarge of a secondary battery. The conventional measure for prevention of any overcharge that may be caused by a charger is carried out by controlling the charge terminal voltage of a battery during the charging operation, and such means is sufficiently effective for a single battery or parallel-connected batteries. However, it is generally frequent that batteries are used in a series-connected state. And in such a case, it is impossible to control the voltage of the individual battery although the series-connection terminal voltage can be controlled. Therefore, when at least one of the series-connected batteries is short-circuited, the other batteries are overcharged during the charging operation, and thus the above method fails to achieve complete prevention of overcharge. Another overcharge preventive measure is based on utilization of a phenomenon that the internal pressure of a battery rises upon occurrence of overcharge, and it is carried out by mechanically cutting the relevant current leadwire to interrupt the charge current. The purpose of this method is not to prevent overcharge itself but to prevent breakdown of the battery that may result from an abnormal rise of the battery temperature or high internal pressure caused with progress of the overcharge. Once the current interruption is executed, the relevant battery is rendered nonusable.

Meanwhile with regard to prevention of overdischarge, there is known a method of selecting a suitable metal for a negative-electrode current collector whose dissolution voltage is possibly as low as zero. For example, the use of nickel instead of copper is somewhat effective but is not completely satisfactory. Particularly in series-connected batteries, over discharge may be unavoidable in one battery due to the difference existing among the individual batteries, and therefore the life of the charge/discharge cycle is extremely deteriorated.

In addition to the above, there is also known the following conventional method as an overcharge/overdischarge preventive measure for nonaqueous secondary batteries.

FIG. 8 is an exemplary constitution of a nonaqueous secondary battery such as a lithium ion type.

In this example, a positive electrode is composed of $LiCoO_2$ 6 as an active material, while a negative electrode 7 is composed of carbon of a graphite structure as an active material. Such active material is held by an aluminum current collector 8 in the positive electrode or by a copper current collector 9 in the negative electrode 7.

The positive and negative active materials are disposed opposite to each other through a separator 10, and the space between the two active materials is filled with an organic electrolyte 11. In the charge and discharge characteristics of this battery, as graphically shown in FIGS. 9 and 10, a close correlation exists between the charge/discharge energy and the battery terminal voltage.

The battery has a design voltage determined by the component materials of the battery and the design thereof, and an action of charging beyond such voltage is termed overcharge. As a result of overcharge, there occur (1) deposition of the lithium metal on the negative electrode, (2) decomposition of the positive-electrode active material, and deposition of the cobalt metal or cobalt compound on the negative electrode due to cobalt ions derived from the decomposition, and (3) decomposition of the organic electrolyte.

Such deposition of the lithium metal, cobalt metal or cobalt compound causes short-circuiting of the positive and negative electrodes, and the decomposition of the positive-electrode active material or the organic electrolyte induces extreme deterioration of the battery. It is therefore impossible to ensure sufficient reliability of the battery unless overcharge is essentially averted.

If a charged battery is discharged with an external load connected thereto, the battery voltage is lowered and, in accordance with continuous discharge, the battery voltage comes to reach the dissolution voltage of the negative-electrode current collector (copper). A further discharging action subsequent to transgression of the dissolution voltage is termed overdischarge. Upon occurrence of such overdischarge, naturally the copper is ionized and liquated into the electrolyte. The dissolution of the collector metal causes deterioration of the current collecting function and fall-off of the negative-electrode active material to consequently reduce the battery capacity. Furthermore, the copper ions thus liquated are deposited abnormally on the negative electrode at the next charging to cause a short-circuiting fault of the positive and negative electrodes. Therefore, it is essentially necessary to avert such overdischarge as well.

As an overcharge/discharge preventive measure for the above-described secondary battery, there is proposed in Japanese patent application No. 03-97734 filed Apr. 26, 1991 a method which utilizes the correlation between the voltage of such secondary battery and the charge/discharge energy thereof by a procedure of continuously detecting the terminal voltage of series-connected batteries and interrupting the charge or discharge current at a predetermined voltage above the design battery voltage or below the dissolution voltage of the negative-electrode current collector metal, thereby preventing any overcharge or overdischarge of each battery to ensure the reliability and safety thereof.

FIG. 11 shows a fundamental arrangement to carry out the overcharge/overdischarge preventive method mentioned above. In this diagram, four batteries are connected in series and parallel to one another. Voltage detectors 12, 13 detect the terminal voltages of the batteries in series-parallel connection and turn off a switch 14 at any terminal voltage above the design voltage to thereby prevent overcharge. Meanwhile, a voltage detector 15 detects the terminal voltage of the series-connected batteries and turns off a switch 16 at any terminal voltage as below the design voltage determined by the metal of the negative-electrode current collector or the cutoff voltage of an apparatus which uses such batteries, thereby preventing overdischarge.

However, there still remains the following problem even with adoption of the preventive measure described. Although the above exemplary arrangement is capable of detecting overcharge of an individual battery or overdischarge of two series-connected batteries, it is impossible to detect any unbalanced charge or discharge of the two batteries during simultaneously charging or discharging of the series-connected batteries. And there may occur an unbalance between the charged or discharged states of the two batteries in such a manner that one battery has been charged to the desired set voltage while the other battery has not yet been charged to the set voltage, or one battery has been discharged to the set voltage while the other battery has not yet been discharged to the set voltage. Particularly in lithium secondary batteries, it is absolutely necessary to avert any overcharge or overdischarge. Therefore, when one of the batteries has been fully charged in the aforementioned conventional circuit, the other battery fails to be fully charged even though overcharge can be averted by turning off the switch, hence inducing an unbalance between the charged states of the two batteries.

OBJECTS OF THE INVENTION

The present invention provides a method of preventing overcharge and overdischarge of batteries even if the capacities thereof are unbalanced due to the characteristic differences among the individual batteries in the process of repeating the charge and discharge cycle.

DESCRIPTION OF THE PREFERRED EMBODIMENTS

Figure 1:
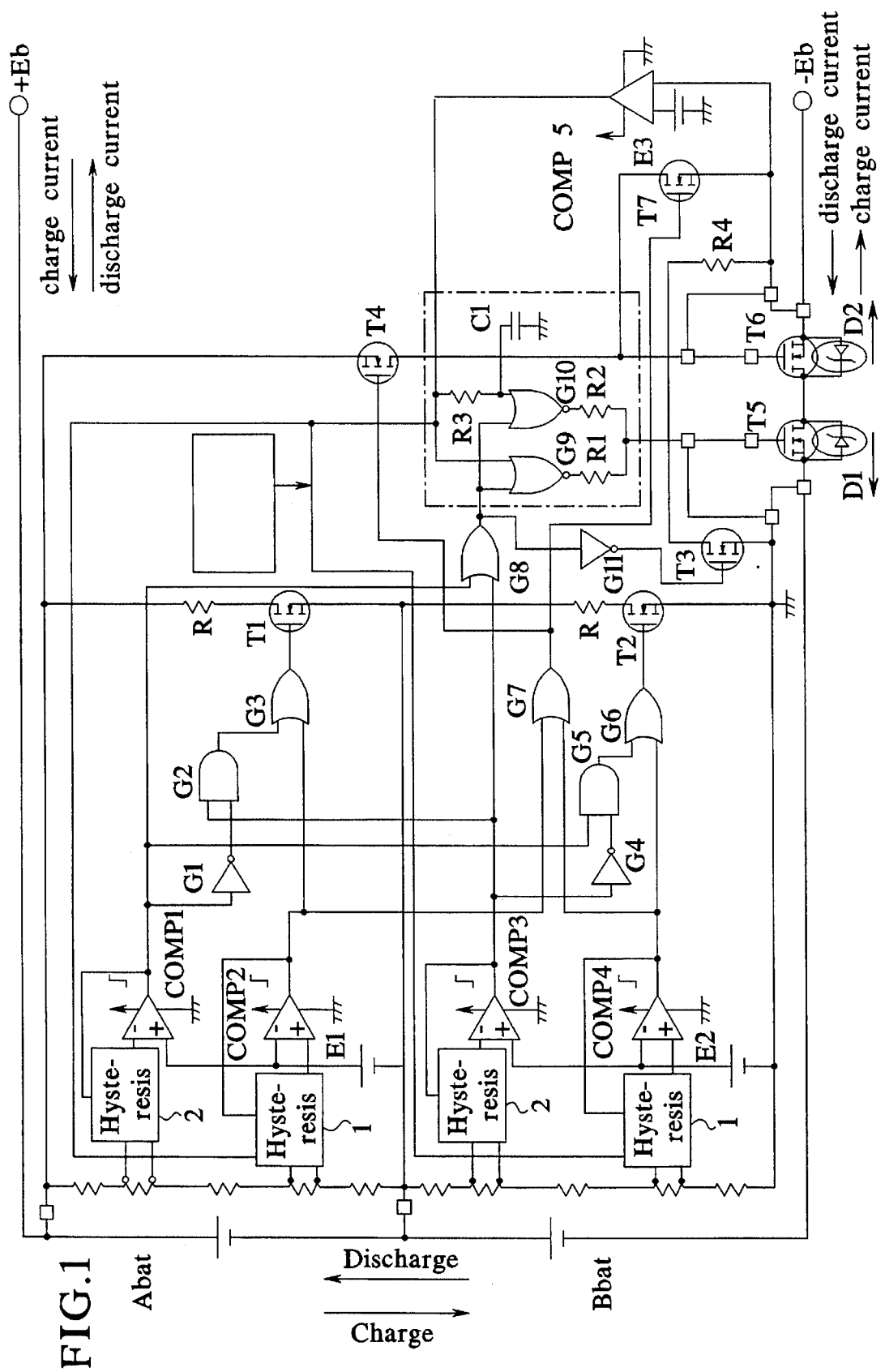
FIG. 1 is a circuit diagram of an exemplary embodiment according to the present invention.

FIG. 1 shows the configuration of an overcharge/overdischarge preventive circuit according to the present invention with a function of balancing the capacities of batteries. This circuit will be described below with regard to detections of overcharge and overdischarge of two batteries Abat and Bbat.

A charge current flows from a charging power supply or a terminal +Eb, which serves as a discharge load terminal, to a terminal −Eb via the secondary batteries Abat and Bbat, an N-channel MOS transistor T5 and an N-channel MOS transistor T6 (hereinafter referred to as transistor T5 and transistor T6 respectively). A comparator COMP2 constituting an overcharge detecting circuit detects an overcharge of, e.g., 4.3 V exceeding a reference voltage El, and then outputs a high-level voltage. (The output voltage is at a low level in a normal charging state.)

In response to such high-level output, a P-channel MOS transistor T4 (hereinafter referred to as transistor T4) is turned off via an OR gate G7, and then an N-channel MOS transistor T7 is turned on to thereby turn off the N-channel MOS transistor T6, so that the charge current is interrupted. And simultaneously therewith, an N-channel MOS transistor T1 is turned on via an OR gate G3, whereby the overcharge overflow of the battery Abat is discharged through a resistor R.

When the voltage of the battery Abat thus discharged down to 4.1 V has been further lowered therebelow, the output of the comparator COMP2 is inverted to a low level, so that the transistors T1 and T7 are turned off while the transistors T4 and T6 are turned on in sequence to resume a rechargeable condition, whereby the batteries Abat and Bbat are both charged.

In case the battery Bbat is overcharged, an operation similar to the above is performed as follows. A charge current flows from the terminal +Eb to the terminal −Eb via the secondary batteries Abat, Bbat and the transistors T5, T6. Subsequently a comparator COMP4 constituting an overcharge detecting circuit detects an overcharge of, e.g., 4.3 V exceeding a reference voltage E2, and then outputs a high-level voltage. (The output voltage is at a low level in a normal charging state.)

In response to such high-level output of the comparator COMP4, the transistor 4 is turned off via the OR gate G7 and the transistor T7 is turned on, so that the charge current is interrupted. And simultaneously therewith, an N-channel MOS transistor T2 is turned on via an OR gate G6, whereby the overcharge overflow of the battery Bbat is discharged through the resistor R.

When the voltage of the battery Bbat thus discharged down to 4.1 V has been further lowered therebelow, the output of the comparator COMP4 is inverted to a low level, so that the transistors T2 and T7 are turned off while the transistors T4 and T6 are turned on in sequence to resume a rechargeable state, whereby the batteries Abat and Bbat are both charged.

It is to be noted that, when the charge current is interrupted by turning off the transistor T6 as a result of turning off the transistor T4 and turning on the transistor T7 via the OR gate G7 in response to the high-level output of the comparator COMP2 or COMP4, the terminal voltage of the battery is lowered to consequently invert the output of the comparator COMP2 or COMP4 to a low level, so that the charging circuit is immediately placed in operation again. Therefore it is important here that, for the purpose of eliminating such a fault, each of the comparators COMP2 and COMP4 needs to have a hysteresis in the operation thereof for realizing a cycle that, when the overcharge overflow of the battery Abat or Bbat has been discharged until arrival of the voltage at 4.1 V, the rechargeable state is resumed to start charging the batteries Abat and Bbat again. In order to meet such requirement, a hysteresis circuit 1 is connected to each noninverting input terminal of the comparators COMP2 and COMP4.

Figure 2A:
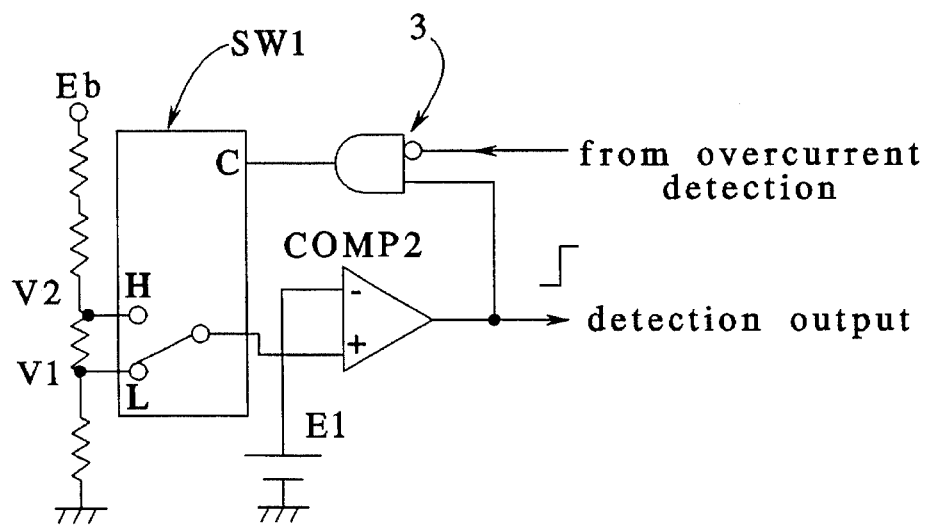
FIG. 2 (A) and (B) are a circuit diagram and an explanatory diagram of a hysteresis circuit for overcharge detection in the present invention.
Figure 2B:
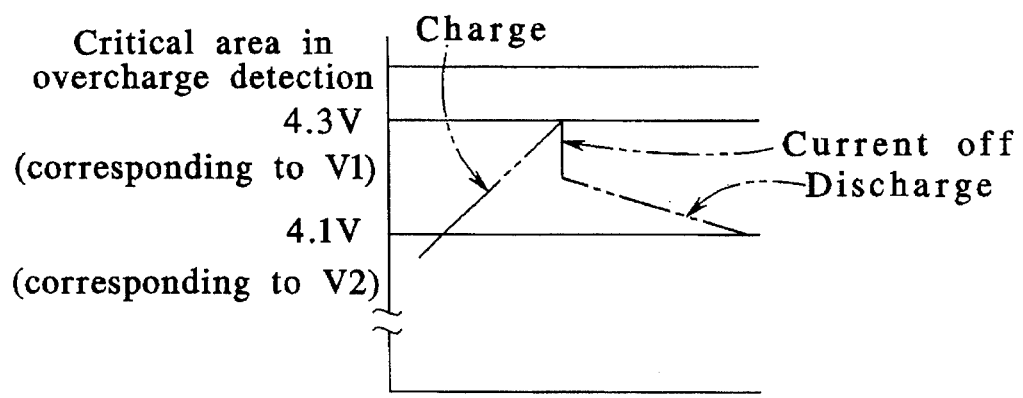

Now a description will be given below with regard to the hysteresis circuit 1. FIG. 2(A) shows an exemplary configuration of the hysteresis circuit 1 connected to the noninverting terminal of the overcharge detecting comparators COMP2 and COMP4, and FIG. 2(B) is an explanatory diagram of an overcharge hysteresis voltage. Hereinafter the battery Abat will be described as an example.

In FIG. 2(A), when the voltage Eb of the battery Abat is raised by charging up to, e.g., 4.3 V and the overcharge-detecting tap voltage V1 of a resistance ladder has exceeded the reference voltage E1, the output of the comparator COMP2 is inverted from a low level to a high level to consequently turn off the transistor T6.

Meanwhile a high-level output of an inhibit circuit 3 is supplied to a control terminal C to change an analog switch SW1 to an H terminal, so that the voltage V2 is used as a comparison voltage. Since the voltage V2 is so set as to become higher than the reference voltage E1 despite any drop of the battery terminal voltage caused as a result of interruption of the charge current, the transistor T6 (shown in FIG. 1) is held in its off-state and therefore the charging action is not started immediately. In this manner, it becomes possible to retain a hysteresis in starting the charging action.

The overcharge hysteresis voltage shown in FIG. 2(B) will now be described below with reference to FIG. 4.

In this diagram, one half of the final charge voltage 8.2 V of the charger is shown as a hysteresis voltage, wherein 4.3 V corresponds to the detection voltage V1 of the resistance ladder, while 4.1 V corresponds to the detection voltage V2. If the final charge voltage is not attained even when the voltage of the battery Abat raised due to the unbalanced charging of the batteries Abat and Bbat has reached a point (e.g., 4.3 V) immediately before a critical area, the overcharge detecting circuit functions to turn off the transistor T6, thereby interrupting the charge current. Upon interruption of the charge current, the battery voltage begins to be lowered, and thereafter it is further lowered through discharge down to 4.1 V by the discharging circuit consisting of the aforementioned transistor T1 and resistor R. When the battery voltage has dropped below 4.1 V, the output of the comparator COMP2 is inverted to a low level to turn on the transistor T6, so that the charging action is resumed until the voltage of the battery Bbat reaches 4.1 V.

The charge cycle of both batteries is executed in this manner to consequently achieve a balanced charging operation while preventing any overcharge of each battery.

If the batteries are placed in a normal charging state under such condition where the transistor T6 is turned off, an undermentioned overcurrent detecting circuit is actuated even by a small current to consequently render the discharge impossible. In this case, therefore, the analog switch SW1 is changed to its L-side by the hysteresis inhibit circuit 3 to thereby turn on the transistor T6.

Now the detection of overdischarge will be described below with regard to the battery Abat taken as an example. In FIG. 1, the comparator COMP1 produces a high-level output upon detection of an overdischarge (e.g., 1.8 V) of the battery Abat. (The output voltage is at a low level in a normal discharge state.)

In response to the high-level output of the comparator COMP1, an N-channel MOS transistor T5 (hereinafter referred to as transistor T5) is turned off via an OR gate G8 and a NOR gate 9, and then an N-channel MOS transistor T3 (hereinafter referred to as transistor T3) is turned off via a gate G11 to thereby interrupt the discharge current. And simultaneously therewith, an N-channel MOS transistor T2 (hereinafter referred to as transistor T2) is turned on via an AND gate G5 and an OR gate G6, whereby the residual capacity of the battery Bbat is consumed through the resistor R.

In this stage the output of the OR gate G3 is inverted to a low level via the gate G1 and the AND gate G2, whereby the transistor T1 is held in its off-state so as not to operate the overdischarge balancing circuit for the battery Abat.

Figure 3A:
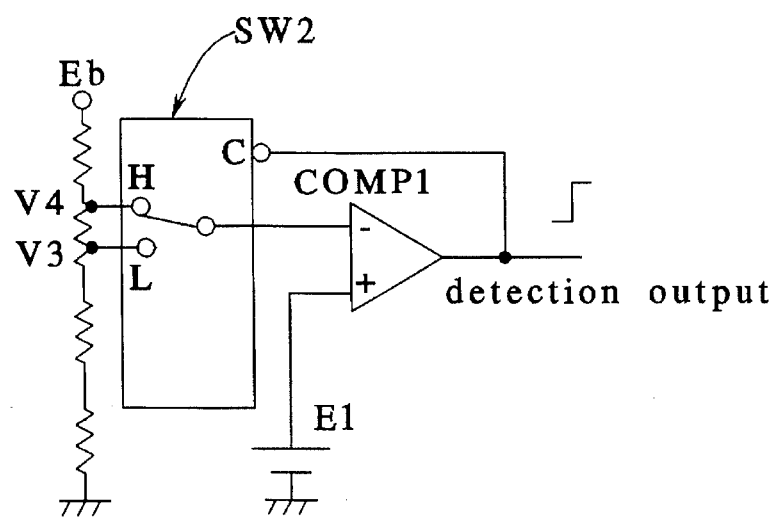
FIG. 3 (A) and (B) are a circuit diagram and an explanatory diagram of a hysteresis circuit for overdischarge detection in the present invention.

In an attempt to retain a hysteresis in the overdischarge detection also, a hysteresis circuit 2 shown in FIG. 3(A) is connected to the noninverting input terminal of the comparator COMP1. In this diagram, when the voltage Eb of the battery Abat is lowered due to discharge and the overdischarge-detecting tap voltage V4 of a resistance ladder has dropped beyond the reference voltage E1, the output of the comparator COMP1 is inverted from a low level to a high level to consequently turn off the transistor T5, thereby interrupting the discharge current.

Figure 3B:
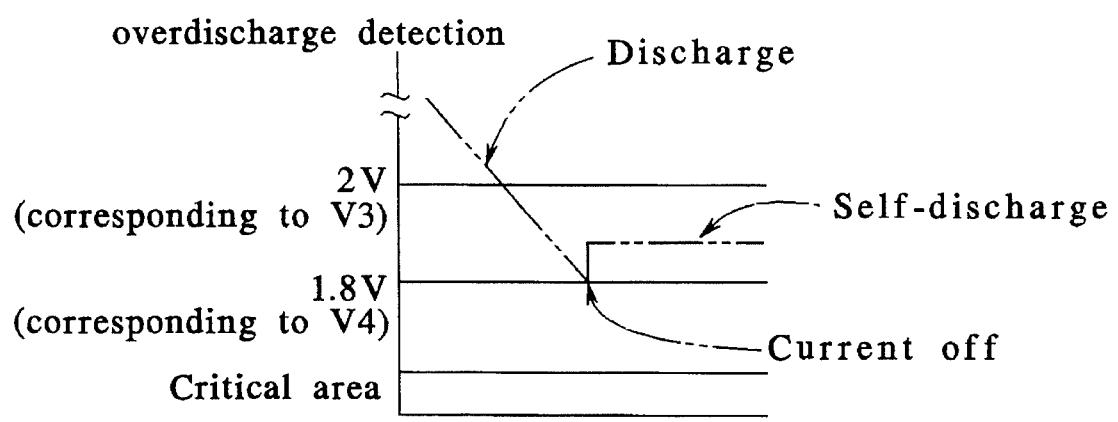

FIG. 3(B) shows the overdischarge hysteresis voltage, which will be described below with reference to FIG. 5.

If the final discharge voltage of an apparatus using the batteries is not attained even when the voltage of the battery Abat has been lowered due to the unbalanced discharging of the batteries down to 1.8 V which is immediately before a critical area, the aforementioned voltage V4 is inputted to the comparator COMP1 to perform the overdischarge detection, thereby turning off the transistors T3 and T5 in sequence. Since the battery voltage is raised upon interruption of the discharge current, the hysteresis voltage (e.g., 2 V) is so set as not to turn on the transistor T5 again immediately.

More specifically, the analog switch SW2 in the hysteresis circuit 2 is changed to its L side so that a voltage V3 higher than the aforesaid voltage V4 is set as a comparison voltage. Therefore, even if the terminal voltage of the battery Abat is raised due to interruption of the discharge current, the aforementioned off-state is maintained since the voltage V3 is set to be lower than the reference voltage E1. And during such period of time, the battery Abat is kept free from any overdischarge while being merely self-discharged to a slight extent. Thus, when the overdischarge detection is actuated, the battery Bbat is discharged by the internal discharge circuit consisting of the transistor T2 and the resistor R, whereby the discharge states of the two batteries are balanced. In this stage, the output of the overdischarge detecting comparator COMP3 for the battery Bbat is at a low level while the output of the gate G4 is at a high level, so that the transistor T2 is turned on via the AND gate G5 and the OR gate G6, whereby the internal discharge of the battery Bbat is executed through the resistor R.

The overdischarge detection is actuated also when the batteries are still connected even after the apparatus using the batteries is switched off at the final voltage.

The procedure of operation described hereinabove with regard to the battery Abat is applied to another battery Bbat as well.

Figure 4:
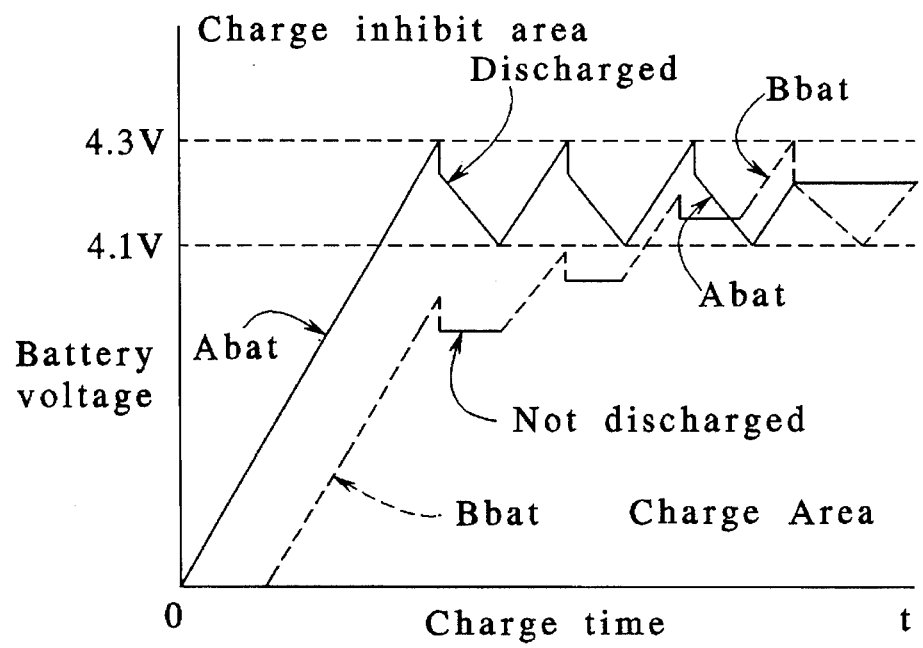
FIG. 4 graphically shows overcharge balance in the present invention.
Figure 5:
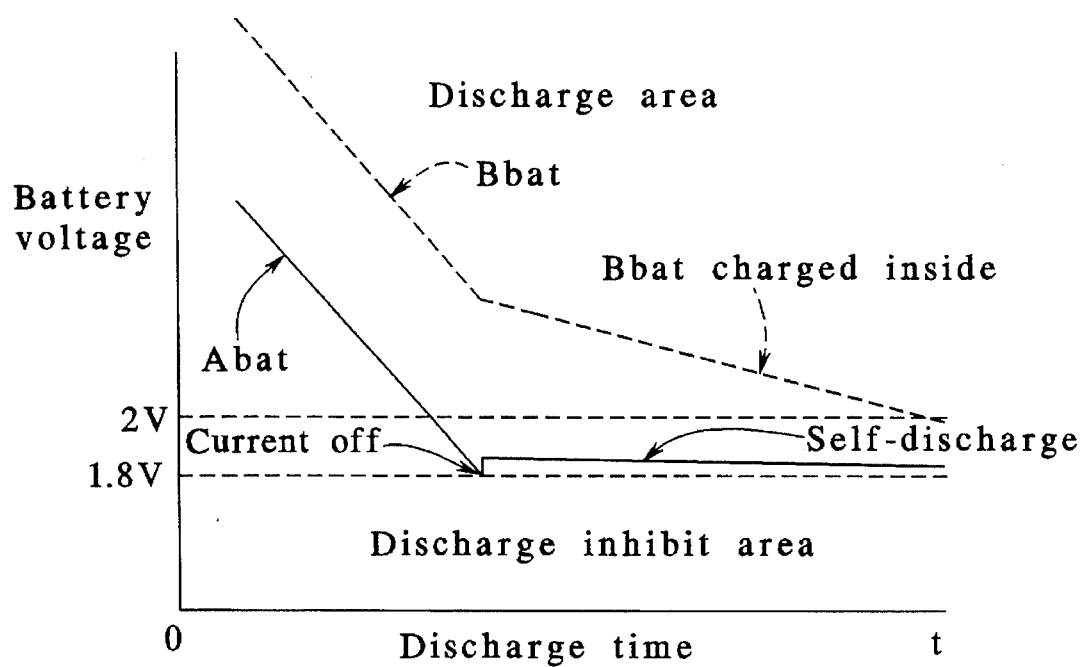
FIG. 5 graphically shows overdischarge balance in the present invention.

In the operation of the overcharge/overdischarge balancing circuit mentioned above, it is observed that, in view of the relationship between the charge time and the battery voltage with respect to the overcharge balance shown in FIG. 4 and also the relationship between the discharge time and the battery voltage with respect to the overdischarge balance shown in FIG. 5, balanced charging can be achieved between 4.1 V and 4.3 V in the case of overcharge while balanced discharging can be achieved between 1.8 V and 2 V in the case of overdischarge by the connection of the hysteresis circuit to the input of each comparator.

Referring now to FIGS. 6(A), 6(B), 7(A) and 7(B), a description will be given on detection of any overcurrent and protection therefrom executed when the overcurrent flows in the aforementioned overcharge/overdischarge detecting circuit as a result of short-circuiting or overload.

Figure 7A:
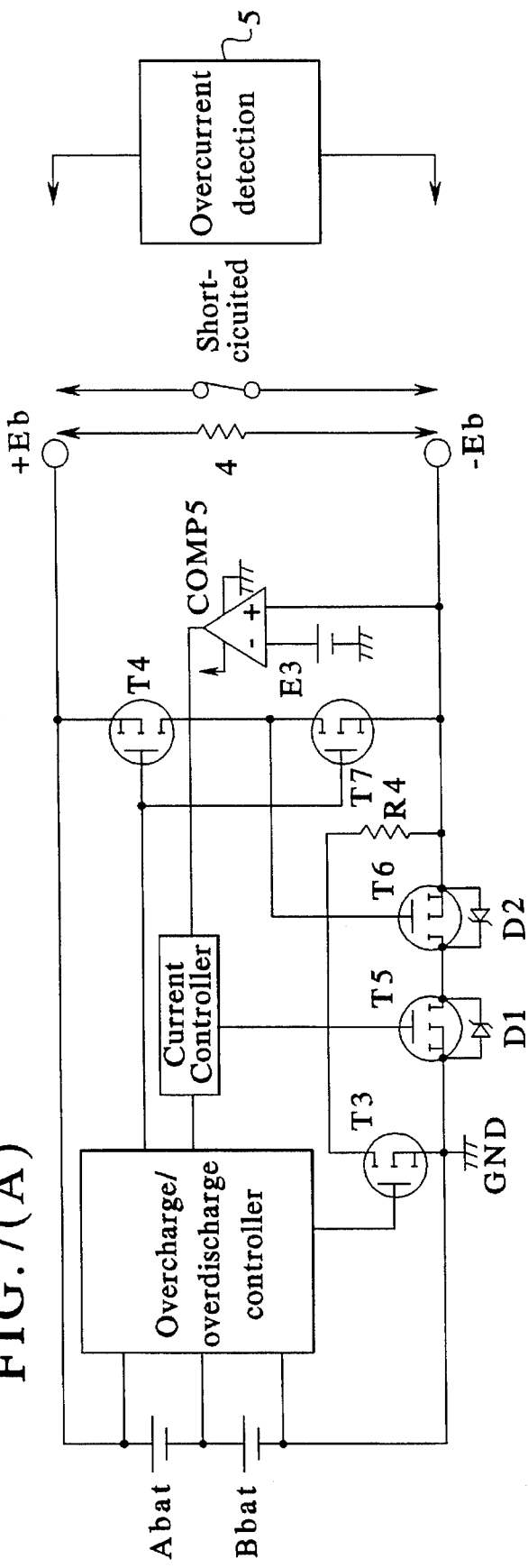
FIG. 7 (A) and (B) are circuit diagrams for explaining reset and overcharge interruption after detection of an overcurrent.
Figure 7B:
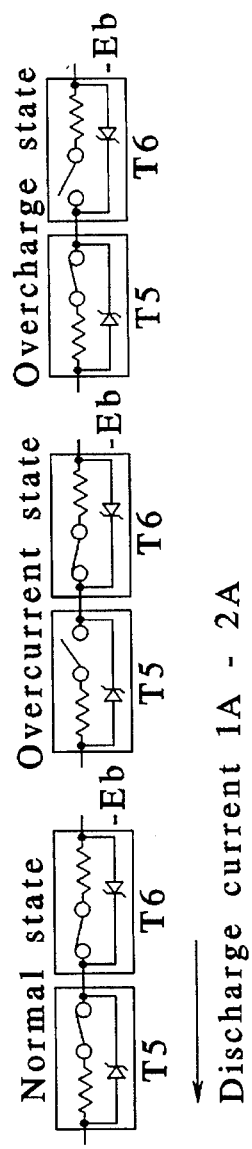
Figure 8:
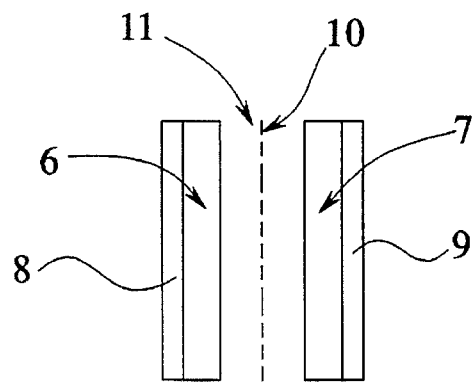
FIG. 8 schematically shows an exemplary structure of a secondary battery.
Figure 9:
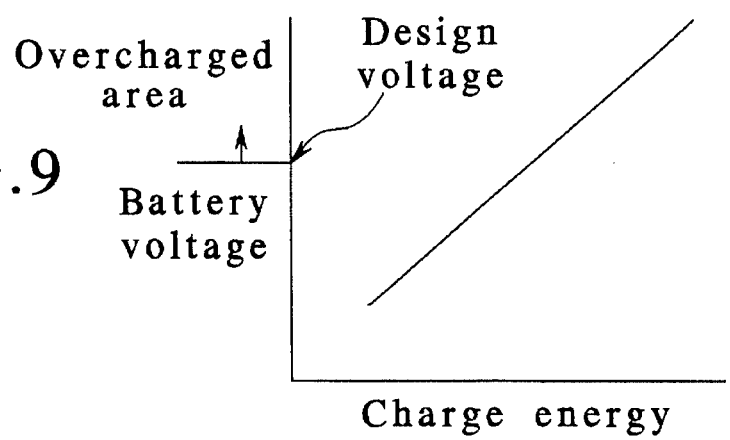
FIG. 9 graphically shows the relationship between the charge energy and the voltage of a secondary battery.
Figure 10:
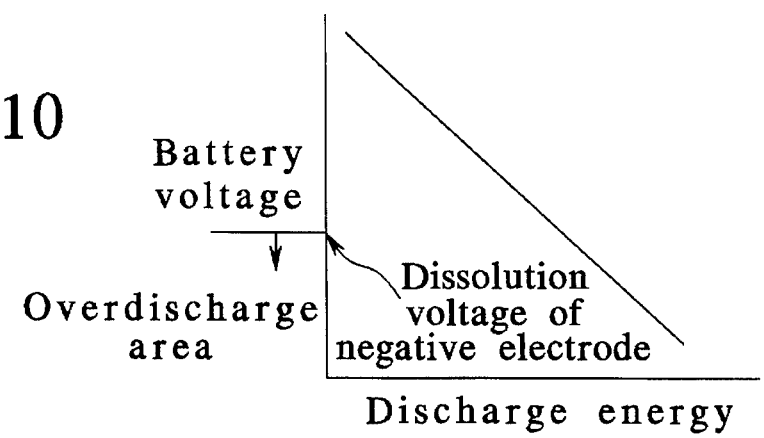
FIG. 10 graphically shows the relationship between the discharge energy and the voltage of a secondary battery.
Figure 11:
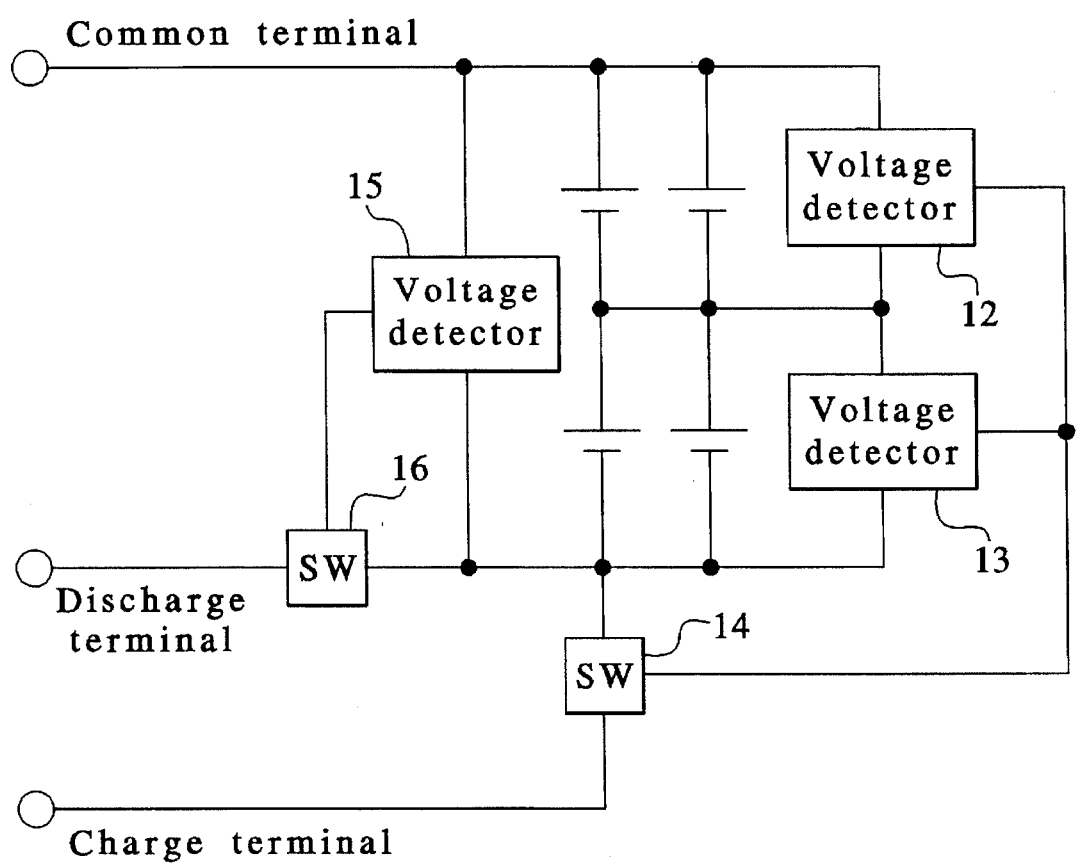
FIG. 11 is a block diagram of a conventional overcharge/overdischarge preventive circuit.

FIG. 7(A) and 7(B) is a circuit diagram where the circuit of FIG. 1 is partially simplified into blocks for explaining a short-circuited state of the +Eb and −Eb terminals to which a discharge load 4 or a charging power supply 5 is connected.

Upon flow of an overcurrent (e.g., 3A) derived from the short-circuiting between the +Eb and −Eb terminals, the voltage caused by such overcurrent and the saturation resistance of transistors T5 and T6 kept in an on-state during the normal operation is applied to the noninverting input terminal of a comparator COMP5 normally at a low level), so that a high-level output is produced from the comparator COMP5 and then is supplied via NOR gales G9 and G10 to the transistor T5, thereby changing its gate voltage Eg to zero to consequently interrupt the overcurrent.

Figure 6A:
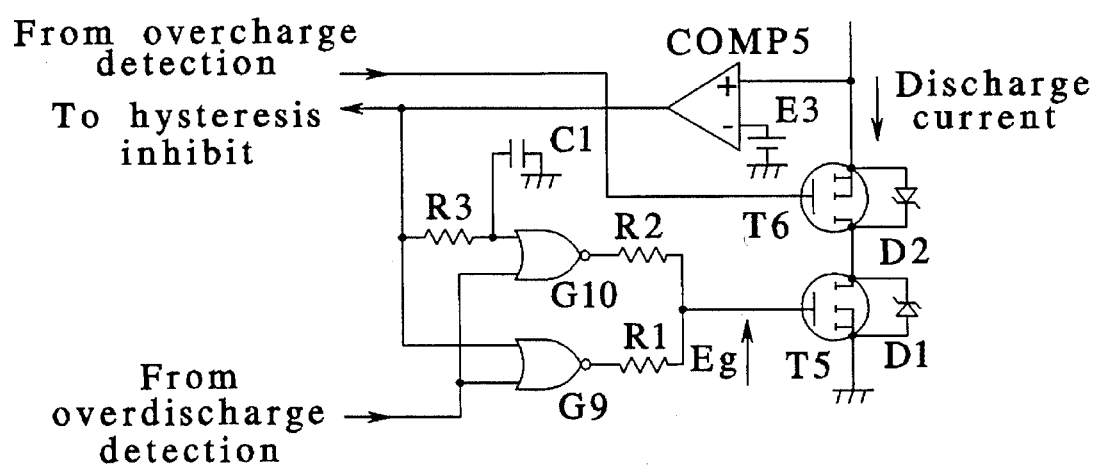
FIG. 6 (A) and (B) are a circuit diagram and an explanatory diagram of a circuit for detection of an overcurrent and protection therefrom.
Figure 6B:
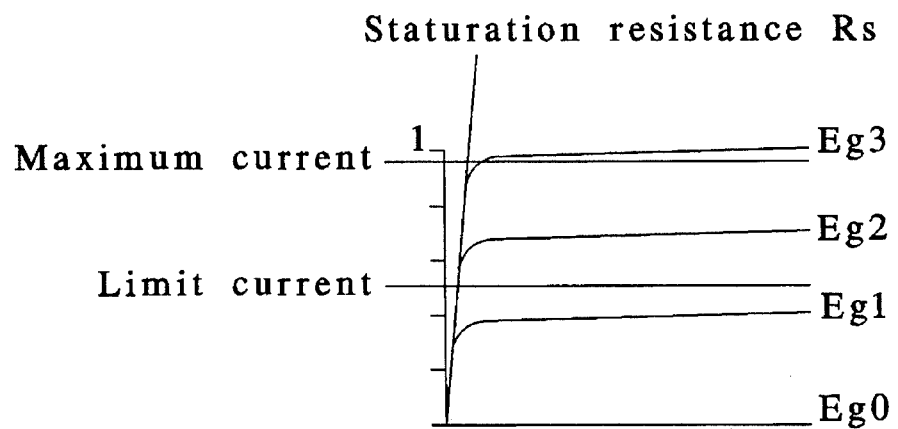

During a normal operation without a flow of any overcurrent, the gate voltage Eg has a value sufficient to cause a flow of the maximum current in the transistor T5 as shown in FIG. 6(B). However, upon detection of any overcurrent, first the voltage at the resistor R1 is changed to zero after a delay (200 μsec) determined by the internal time constant of the circuit. And during such period of time, the gate voltage Eg of the transistor T5 is divided by the resistors R1 and R2 to be lowered, whereby the current flowing in the transistor T5 is limited. Subsequently the voltage at the resistor R2 is changed to zero after a delay (several msec) determined by the time constant C1R3 of the resistor R3 and the capacitor C1. And when the gate voltage Eg has reached zero, the transistor T5 is turned off to interrupt the overcurrent, thereby protecting the circuit therefrom. The reference voltage E3 of the comparator COMP5 is so set as to detect the limit current (FIG. 6(B)) flowing in the transistor T5.

As described above, when the overdischarge detection is actuated, the gate voltage is naturally reduced to zero to thereby turn off the transistor T5.

However, if the battery is discharged in the state where the transistor T6 is turned off by the overcharge detection, a current flow is caused via a parasitic diode D2 of the transistor T6, so that a forward voltage drop (0.7 V) through such parasitic diode is detected by the comparator COMP5, and therefore the aforementioned overcurrent detecting circuit may be erroneously placed in operation even though the above current is not any overcurrent to consequently turn off the transistor T5. In such a case, the output of the hysteresis inhibit circuit 3 in the overcurrent detecting circuit is inverted to a low level to change the analog switch SW to its L terminal, thereby halting the overcurrent detection and turning on the transistor T6. The speed of this operation needs to be higher than that of the overcurrent protecting circuit.

Referring now to FIG. 7(A) and 7(B), a description will be given below with regard to how the circuit is reset after detection of an overcurrent.

Upon flow of any overcurrent due to short-circuiting of the load or occurrence of any overload as mentioned, the comparator COMP5 detects the overcurrent and then turns off the transistor T5. When the transistor T5 is thus turned off, the potential difference between the −Eb terminal and the battery ground GND is pulled toward the load via the parasitic diode D1 of the transistor T5 and is thereby raised to a high voltage +Eb (4 to 8 V). When the overload is removed in such a state, the circuit fails to be reset if the −Eb terminal is continuously held at the high voltage. Therefore a small current is caused to flow via the transistor T3 and the resistor R4 to lower the voltage at the −Eb terminal to the vicinity of zero volt. Although this current is small, if the overloaded state (including a light-loaded state changed from the preceding overloaded state) is left uncorrected long, it follows that a useless current flows from the battery. Since such phenomenon brings about a problem particularly in the final stage of the discharge, the transistor T3 is turned off to interrupt the current when the overcurrent detection is actuated.

If the transistor T6 is turned off during the overcurrent detection, the terminal voltage of the charger is raised and then the voltage at the −Eb terminal is pulled by such raised voltage to become lower than the battery ground GND differently from the voltage pulled by the characteristic of the charger. When the −Eb terminal is turned to be negative, there may occur an occasion where the transistor T6 fails to be completely turned off even if its gate voltage is lowered to the battery ground GND. Therefore, since the transistor T7 is in its on-state at the time of detection of any overcharge, the gate of the transistor T6 is short-circuited to the −Eb terminal via the transistor T7 to thereby perform complete interruption. In case the overcharge detection is not in operation, the transistor T4 is in its on-state to supply the gate voltage to the transistor T6, which is thereby maintained in the on-state.

The embodiment shown in FIG. 1 represents an exemplary circuit for realizing the technical concept of the present invention, and it is a matter of course that the component elements, the circuit system and the set voltages are not limited merely to those in the embodiment. It is also to be understood that the present invention is applicable to series connection of three or more secondary batteries, and it may be used in the form of an integrated circuit. Such circuit can be incorporated inside or outside of batteries as well as in a battery pack or a charger.

According to the present invention where overcharge/overdischarge detection is performed with a hysteresis, the capacities of individual secondary batteries can be balanced during an overcharge or overdischarge action to achieve enhancement in the charge/discharge cycle while attaining complete prevention of any overcharge or overdischarge of each battery.

We claim as our invention:

1. A circuit for preventing overcharge and overdischarge of series-connected secondary batteries, comprising:
   an overcharge detecting circuit and an overdischarge detecting circuit having a hysteresis characteristic and connected between a positive electrode and a negative electrode of each of said secondary batteries;
   a discharge circuit connected between the positive and negative electrodes of each of said secondary batteries and controlled by an output level of said overdischarge detecting circuit;
   a circuit for interrupting charge current to said secondary batteries in accordance with an output level of said overcharge detecting circuit;
   a circuit for interrupting discharge current from said secondary batteries in accordance with the output level of said overdischarge detecting circuit; and
   a terminal to which is selectively connected one of a discharge load and charging power;
   wherein overcharge and overdischarge of any of said secondary batteries are prevented, and capacities of said secondary batteries are balanced in both overcharge and overdischarge actions.

2. A circuit for preventing overcharge and overdischarge of series-connected secondary batteries, comprising;
   a detecting means for detecting overcharge and overdischarge state of each of said series-connected secondary batteries including, an overcharge detecting circuit means for comparing a voltage of each of said secondary batteries and a first reference voltage, an overdischarge detecting circuit means for comparing a voltage of each of said secondary batteries and a second reference voltage, a first switch for cutting off discharging current, a second switch for cutting off charging current, control means for controlling on and off of said first and second switches according to detection results of said detecting means, balance recovering means for recovering capacity balance of each of said series-connected secondary batteries, a discharge load connectable to said secondary batteries, and a charging power supply terminal to which is connectable a charging power supply.

3. A circuit for preventing overcharge and overdischarge of series-connected secondary batteries according to claim 2, wherein said balance recovering means is connected between a positive electrode and a negative electrode of each of said series-connected secondary batteries and is controlled by the detection results of said detecting means.

4. A circuit for preventing overcharge and overdischarge of series-connected secondary batteries according to claim 3, wherein said control means controls said balance recovering means to discharge a battery in a overcharged state upon detection of overcharge by said detecting means.

5. A circuit for preventing overcharge and overdischarge of series-connected secondary batteries according to claim 3, wherein said control means controls said balance recovering means to discharge a battery not in an overdischarge state upon detection of overdischarge by said detecting means.

6. A circuit for preventing overcharge and overdischarge of series-connected secondary batteries according to claim 2, wherein said circuit further comprises an overcurrent detection means for detecting an over current in said circuit, and a cut off means for cutting off said over current.

7. A circuit for preventing overcharge and overdischarge of series-connected secondary batteries as claimed in claim 6, wherein said control means controls said overcurrent detection means to inhibit detection of any overcurrent and said second switch to turn on, when said secondary batteries are discharged in an overcharge state upon detection of overcharge by said detecting means.

8. A circuit for preventing overcharge and overdischarge of series-connected secondary batteries as claimed in claim 7, wherein said control means controls a negative terminal voltage of said charging power supply terminal to be lowered to approximately zero volts when said circuit is reset after detection of said overcurrent.

* * * * *